(12) United States Patent
Van Dis (10) Patent No.: US 11,274,061 B2
(45) Date of Patent: Mar. 15, 2022

(54) COATING APPARATUS FOR CONTAINERS

(71) Applicant: Arkema B. V., Ke Vondelingenplaat-Rotterdam (NL)

(72) Inventor: Bram Van Dis, AN Kruisland (NL)

(73) Assignee: Arkema B.V., Ke Vondelingen (NL)

( * ) Notice: Subject to any disclaimer, the term of this patent is extended or adjusted under 35 U.S.C. 154(b) by 152 days.

(21) Appl. No.: 16/093,991

(22) PCT Filed: Apr. 14, 2017

(86) PCT No.: PCT/EP2017/059065
§ 371 (c)(1),
(2) Date: Oct. 16, 2018

(87) PCT Pub. No.: WO2017/182409
PCT Pub. Date: Oct. 26, 2017

(65) Prior Publication Data
US 2019/0127269 A1    May 2, 2019

(30) Foreign Application Priority Data

Apr. 18, 2016 (EP) .................................... 16165857

(51) Int. Cl.
*C03C 17/00* (2006.01)
*B65D 23/08* (2006.01)
(Continued)

(52) U.S. Cl.
CPC ........ *C03C 17/005* (2013.01); *B65D 23/0807* (2013.01); *C03C 17/2453* (2013.01); *C23C 16/045* (2013.01); *C23C 16/407* (2013.01); *C23C 16/458* (2013.01); *C23C 16/45589* (2013.01); *C23C 16/45591* (2013.01); *C23C 16/45595* (2013.01); *C23C 16/54* (2013.01); *C03C 2217/211* (2013.01); *C03C 2218/152* (2013.01); *C03C 2218/1525* (2013.01)

(58) Field of Classification Search
CPC .......................... C03C 17/005; B65D 23/0807
See application file for complete search history.

(56) References Cited

U.S. PATENT DOCUMENTS

| | | |
|---|---|---|
| 4,389,234 A | 6/1983 | Lindner |
| 4,668,268 A | 5/1987 | Lindner et al. |
| | (Continued) | |

FOREIGN PATENT DOCUMENTS

| | | | |
|---|---|---|---|
| EP | 0 378 116 A1 | 6/1993 | |
| EP | 0 378 116 B1 | 6/1993 | |
| | (Continued) | | |

*Primary Examiner* — Robert A Vetere
(74) *Attorney, Agent, or Firm* — Lynn B. Morreale (57) ABSTRACT

The invention relates to a coating apparatus also called coating tunnel or coating hood for applying a protective coating to hollow glass containers. In particular it relates to a coating apparatus also called coating tunnel or coating hood with a guidance plate for the carrier gas comprising a coating compound for applying the protective coatings to glass containers. The present invention also relates to a coating apparatus also called coating tunnel or coating hood with a guidance plate installed between the inner side wall and the outer wall of the tunnel where the conveyer belt with the containers is passing by.

8 Claims, 6 Drawing Sheets

(51) Int. Cl.
*C03C 17/245* (2006.01)
*C23C 16/04* (2006.01)
*C23C 16/455* (2006.01)
*C23C 16/54* (2006.01)
*C23C 16/40* (2006.01)
*C23C 16/458* (2006.01)

(56) References Cited

U.S. PATENT DOCUMENTS

| | | | | |
|---|---|---|---|---|
| 5,140,940 A | * | 8/1992 | Lindner | C03C 17/005 |
| | | | | 118/724 |
| 2001/0038794 A1 | * | 11/2001 | Stewart | F23L 17/005 |
| | | | | 417/53 |
| 2015/0138723 A1 | * | 5/2015 | Shedd | F25B 25/00 |
| | | | | 361/679.47 |
| 2016/0101898 A1 | | 4/2016 | Meurer et al. | |

FOREIGN PATENT DOCUMENTS

| | | | | |
|---|---|---|---|---|
| WO | WO 96/33955 | 10/1996 | | |
| WO | WO-0125503 A1 | * 4/2001 | ............ | C23C 16/04 |
| WO | WO 2011/025503 A1 | 3/2011 | | |

* cited by examiner

COATING APPARATUS FOR CONTAINERS

CROSS-REFERENCE TO RELATED APPLICATIONS

This application is a national stage application under 35 U.S.C. § 371 of PCT/EP2017/059065, filed Apr. 14, 2017 which claims benefit to application EP16.165857.0, filed Apr. 18, 2016.

FIELD OF THE INVENTION

The present invention relates to a coating apparatus also called coating tunnel or coating hood for applying a protective coating to hollow glass containers.

In particular it relates to a coating apparatus also called coating tunnel or coating hood with a guidance plate for the carrier gas comprising a coating compound for applying the protective coatings to glass containers.

More particularly the present invention relates to a coating apparatus also called coating tunnel or coating hood with a guidance plate installed between the inner side wall and the outer wall of the tunnel where the conveyer belt with the containers is passing by.

Technical Problem

Hollow glass containers are produced from molten glass at molds at high temperatures. As the surface of these containers is fragile and in order to preserve the strength of the glass and to prevent any direct glass to glass contact of the respective containers in order to avoid damage, they are surface coated directly after forming of the container.

Such a coating that includes tin or tin tetrachloride, titanium or other heat decomposable metallic or organometallic compounds protects the glass container surface in from damage such as abrasions and scratches, which result in a loss of tensile strength for the glass container. The need for high tensile strength in a glass container is particularly acute when containers are mass produced, move rapidly in close proximity along high speed conveyor lines.

This coating application is done inside a coating apparatus also called a coating tunnel or coating hood with a so called hot end coating by chemical vapor deposition usually in forming a thin layer of a metal oxide, for example tin oxide. The objective is to coat the outside of the bottle with a homogenous even layer except for the so called finish.

The coating tunnel or coating hood receives the glass containers via a conveyer belt from the glass container making equipment with a relatively high speed, meaning between 0.3 up to 1.5 m/s which corresponds to approximately 90 to 700 glass containers per minute. The temperature of the containers excess 400° C. at the surface of the containers, so that when the heat decomposable inorganic metallic or organometallic compound (coating compound) is applied thereto, said compound reacts immediately and is converted to a metal oxide coating. The coating compound is fed in the coating tunnel and circulates inside with the aid of a carrier gas around the passing glass containers.

As the glass containers pass the coating hood at this high speed they risk to draw the coating compound out of the tunnel when leaving the hood through the outlet. The coating compound can attack building components and give health and safety issues. A venting system has to be installed for above mentioned reasons. For avoiding and minimizing this, the carrier gas comprising the coating compound is sucked into an exhaust system and is discarded. Consequently the coating compounds and chemicals are lost and the coating performance in view of introduced coating chemical is rather low.

On the other side when entering the tunnel through the inlet the glass containers draw in fresh air from the outside. In doing so they dilute the coating compound inside the tunnel. In order to apply a minimum necessary coating thickness on the glass containers more coatings compound has to be introduced in order to guarantee the required concentration of the coating chemical in the coating hood or tunnel for the chemical vapor deposition.

There is still the need for more efficient glass coating hoods, with low losses of the coating compound material to the atmosphere and a homogeneous application of the coating on the glass container.

An objective of the present invention is to have a more homogenous distribution of the coating on the surface of the glass containers.

Another objective of the present invention is to reduce the variation of the thickness of the coating on the glass container surface.

Another objective of the present invention is to lower the discharge of the coating chemical.

An objective of the present invention is to have a lower consumption of the coating chemical while applying the same thickness of coating to the glass container.

Still another objective of the present invention is to lower the emissions of chemicals in the coating area and near the coating tunnel or coating hood and reduce the exposure of chemicals in the surrounding working area.

Again another objective of the present invention is to decrease the cleaning intervals of the coating hood and make the cleaning of the equipment easier.

An additional objective of the present invention is to provide a coating hood with a better efficiency, coating more bottles at the same time.

Surprisingly it has been found that the installation of a guidance plate, some or several of before mentioned problems can be solved.

BACKGROUND OF THE INVENTION

Prior Art

Coating apparatus for glass containers and the respective standard components are well known from the prior art.

The U.S. Pat. No. 4,389,234 describes a glass coating hood possessing two or multiple loops. The coating is first fed into an innermost loop and then in an outermost loop. There is also a possibility of using a third loop, but all loops are recirculating loops in order to make better use of the coating material. Consequently the concentration of the coating compound decreases which each recirculating loop. At the end the non used coating compound enters an exhaust system.

The U.S. Pat. No. 5,140,940 describes also a double loop coating hood, as described before. The coating apparatus based on its respective embodiments contains single or multiple air circulating loops.

The document EP0378116 describes a hot end coating apparatus. The hot end coating apparatus has two additional separate air circuits in the inlet and outlet region of a vapour-deposition hood. The air circuits produce two opposite flow zones flowing through the vapour-deposition hood in the transverse direction, the inner flow zone being enriched to the maximum degree with a coating agent and the outer flow zone forming a protective air curtain consisting of the used air from the coating zone, the degree of enrichment of the said air being correspondingly lower. However two additional feed points of the coating agent are needed one for each circuit.

The document WO2001/0255503 describes a glass container coating hood having additional loops; in one embodiment one loop of air or in another embodiment the hood uses counter current loops of air for carrying the coating. The coating hood comprises means for shaping the air flow.

The document WO96/33955 describes a method and apparatus for applying a layer to bottles. The method is made by a coating apparatus that comprises a gas curtain screening apparatus arranged before the inlet and/or after the outlet of the coating tunnel. The gas curtain is fed by pure gas, no coating causing chemical is added, nitrogen or ambient air are exemplified, in order to avoid clogging of the outflow openings.

The document WO2014/177651 discloses a coating hood having an air entry and a loop returning the air enriched with the coating compound and carrier gas from the outlet to the inlet of the coating hood.

None of the cited prior art discloses a coating apparatus having such a guidance plate installed.

BRIEF DESCRIPTION OF THE INVENTION

Surprisingly it has been discovered that a coating apparatus for applying a coating on glass containers with a chemical compound comprising:
 a housing (2) with a coating tunnel,
 a conveyer belt (3) moving the containers (20) through the coating tunnel from the inlet (5) to the outlet (6) of the said coating tunnel,
 at least one circuit (7) for circulation of a coating compound and
 a guidance plate (25);
solves the above mentioned problems.

Surprisingly it has also been discovered that a coating apparatus for applying a coating on glass containers with a chemical compound comprising:
 a housing (2) with a coating tunnel,
 a conveyer belt (3) moving the containers (20) through the coating tunnel from the inlet (5) to the outlet (6) of the said coating tunnel,
 at least one circuit (7) for circulation of a coating compound and
 at least one guidance plate (25);
solves the above mentioned problems.

It has also been found that a process of applying a coating on the surface of glass containers comprising the steps of:
 conveying the glass containers (20) on a conveyer belt (3) through a coating tunnel inside a housing (1) from the inlet (5) to the outlet (6),
 circulating a coating compound through the coating tunnel with a circuit (7) comprising a guidance plate (25).
can solve the above mentioned problems.

Surprisingly it has also been discovered that the use of at least one guidance plate (25) in a coating apparatus for applying a coating on glass containers with a chemical compound comprising:
 a housing (2) with a coating tunnel,
 a conveyer belt (3) moving the containers (20) through the coating tunnel from the inlet (5) to the outlet (6) of the said coating tunnel,
 at least one circuit (7) for circulation of a coating compound solves the above mentioned problems.

Surprisingly it has also been discovered that the introduction of such a guidance plate to the coating apparatus for applying a coating on glass containers with a chemical compound, yields to a more homogenous distribution of the coating on the surface of the glass containers and/or reduces the consumption of the coating chemical and/or lower the discharge of the coating chemical.

BRIEF DESCRIPTION OF DRAWINGS

The invention is best understood from the following detailed description when read in connected with the accompanying drawings with the following figures.

DETAILED DESCRIPTION OF THE INVENTION

In a first aspect, the present invention relates to a coating apparatus for applying a coating on glass containers with a chemical compound comprising:
 a housing (2) with a coating tunnel
 a conveyer belt (3) moving the containers (20) through the coating tunnel from the inlet (5) to the outlet (6) of the said coating tunnel
 at least one circuit (7) for circulation of a coating compound and
 at least one guidance plate (25).

In a second aspect the present invention relates to a process of applying a coating on the surface of glass containers comprising the steps of:
 conveying the glass containers (20) on a conveyer belt (3) through a coating tunnel inside a housing (1) from the inlet (5) to the outlet (6),
 circulating a coating compound through the coating tunnel with a circuit (7) comprising a guidance plate (25).

In a third aspect, the present invention relates to the use of a guidance plate in a coating apparatus for applying a coating on glass containers with a chemical compound comprising:
 a housing (2) with a coating tunnel
 a conveyer belt (3) moving the containers (20) through the coating tunnel from the inlet (5) to the outlet (6) of the said coating tunnel
 at least one circuit (7) for circulation of a coating compound.

According to another aspect the present invention relates to a glass container on which a coating has been applied on its surface by a process comprising the steps of:
 conveying the glass container (20) through a coating tunnel from the inlet (5) to the outlet (6), circulating a coating compound through the coating tunnel with a circuit (7) comprising a guidance plate (25).

According to an additional aspect the present invention relates to the use of a coating apparatus for applying a coating on the surface of a glass container, said coating apparatus is comprising:

a housing (2) with a coating tunnel a conveyer belt (3) moving the containers (20) through the coating tunnel from the inlet (5) to the outlet (6) of the said coating tunnel at least one circuit (7) for circulation of a coating compound and at least one guidance plate (25).

Additionally the coating apparatus for applying a coating on glass containers with a chemical compound comprises blowing means (12), slots (30) in the inner side wall (80).

A circuit (7) for circulation the coating compound is also called loop. The coating apparatus can also comprise several circuits or loops. It comprises at least one circuit or primary loop, where the coating compound or coating generation compound is added. This place where the coating compound or coating generation compound is added is called feed point.

According to a variation of the present invention the coating apparatus can also comprise one or more recirculating loops (8). The recirculating loop or loops (8) is or are after the primary loop (7a) and before the carrier gas flow that is separated, in the sense of the direction of the passing containers on the conveyer belt. Such a recirculating loop (8) is not shown in FIGS. 2 and 3, but is well known from prior art as presented in FIG. 1.

By the generic term "air" as used is denoted the carrier gas that is used for the coating compound. It is obvious that any inert gas or a gas that is inert to the coating compound, the container and the interior of the coating hood, such as nitrogen could be used. Because of its convenience and low cost however the preferred gas is air.

By the term "coating compound" as used in the present invention is denoted a chemical compound that is introduced in the coating apparatus. The coating compound is used directly to coat a surface or it is transformed during the coating application in another compound that forms the coating. In the latter case it could also be called coating generating compound.

By the term "exhaust" as used is denoted the carrier gas that is still loaded with a minor quantity of the coating compound not applied to the glass container that escapes at the entry and especially the outlet of the coating tunnel, where the containers enter and sort.

By the term "loop" as used in the present invention is denoted a circuit for the carrier gas or air loaded with the coating compound that enters and leaves the coating tunnel. Such a loop comprises at least a jet slot and a least one receiving slot that are located on the opposite inner side walls of the hood. The loop could comprises also conduits in form of tubes and pipes. These conduits in form of tubes and pipes are necessary to transport the carrier gas from the receiving slot to the jet slot By the term "primary loop" as used in the present invention is denoted a circuit that comprises at least a feed point of the coating compound and circulates the carrier gas loaded with the coating compound or air loaded with the coating compound. The loop or circuit enters and leaves twice the coating tunnel by respective jet slots and receiving slots. In other words the loop or circuit makes a complete 360° turn.

By the term "recirculating loop" as used in the present invention is denoted a circuit that does not comprise any feed point and that recirculates the carrier gas loaded with the coating compound or air loaded with the coating compound coming from the primary loop.

By the term "circuit" as used in the present invention is denoted a pathway for the circular flow of the carrier gas or air comprising the coating compound or coating generating compound through the respective parts of the coating apparatus.

Figure 1A:
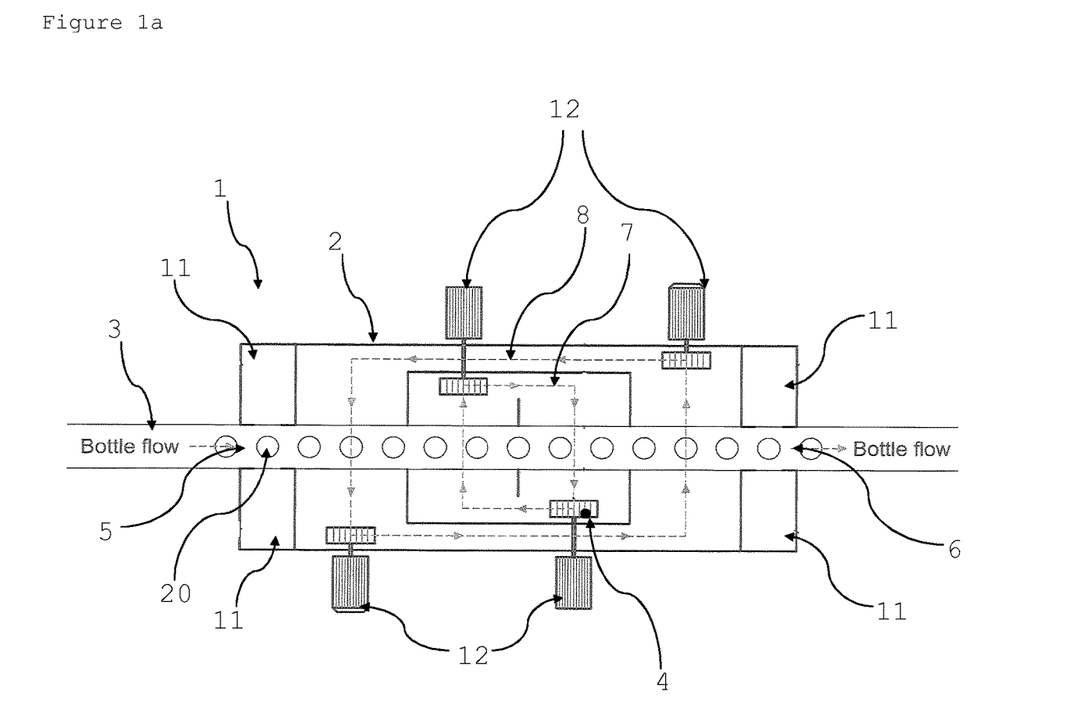
FIG. 1a: schematic representation of existing hood from the state of the art.

With regard to a coating apparatus from the prior art, an embodiment of said coating apparatus is shown in FIG. 1a. The coating apparatus comprises a housing (2) with coating tunnel, a conveyer belt (3) moving the containers (20) through the coating tunnel from the inlet (5) to the outlet (6) of the said coating tunnel, one circuit being the primary loop (7) with a least one feed point (4) for the coating compound, one or more circuits being recirculating loops (8), blowing means (12) and exhaust means (11) in proximity of the inlet (5) end outlet (6). Details of such a coating apparatus and its components can be found in U.S. Pat. No. 4,668,268 or 4,389,234.

Figure 1B:
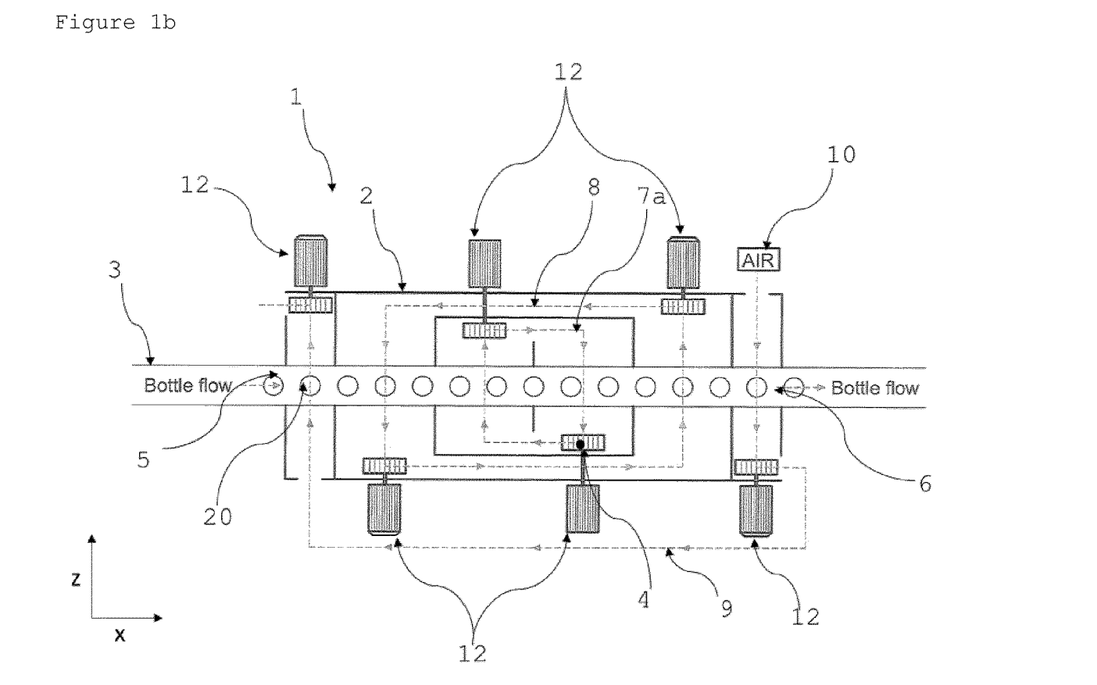
FIG. 1b: schematic representation of existing hood from the state of the art with a recirculation loop (8) and half open loop (9).

Still with regard to a coating apparatus from the prior art, another embodiment of such a coating apparatus is shown in FIG. 1b. Said coating apparatus comprises a housing (2) with coating tunnel, a conveyer belt (3) moving the containers (20) through the coating tunnel from the inlet (5) to the outlet (6) of the said coating tunnel, one primary loop (7) with a least one feed point (4) for the coating compound, blowing means (12), optionally one or more recirculating loops (8) and a half open loop (9) going from the outlet (6) to the inlet (5) of the coating tunnel. Details of such a coating apparatus and its components can be found in document WO2014/177651.

Figure 2:
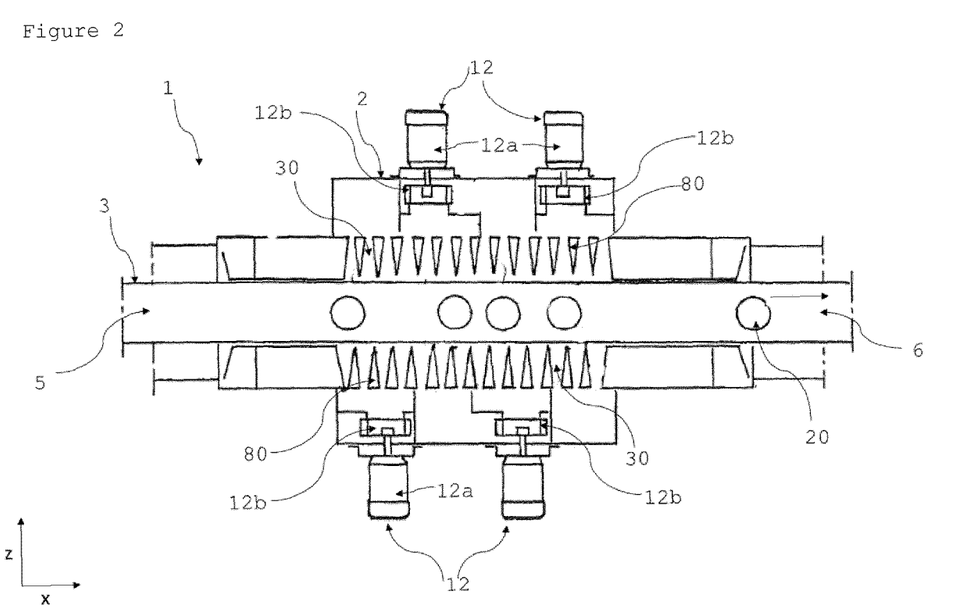
FIG. 2: schematic representation of existing hood from the state of the art with shown slots in the inner side wall.

Still with regard to a coating apparatus from the prior art, another embodiment of such a coating apparatus is shown in FIG. 2. Said coating apparatus comprises a housing (2) with coating tunnel, a conveyer belt (3) moving the containers (20) through the coating tunnel from the inlet (5) to the outlet (6) of the said coating tunnel, blowing means (12) comprising a blower wheel (12a) and a motor (12a) for turning the blower wheel, for circulating the coating compound through the circuits or respective loops of the coating tunnel and inner side wall (80) with slots (30). Details of such a coating apparatus and its components can be found in U.S. Pat. No. 5,140,940.

Figure 3:
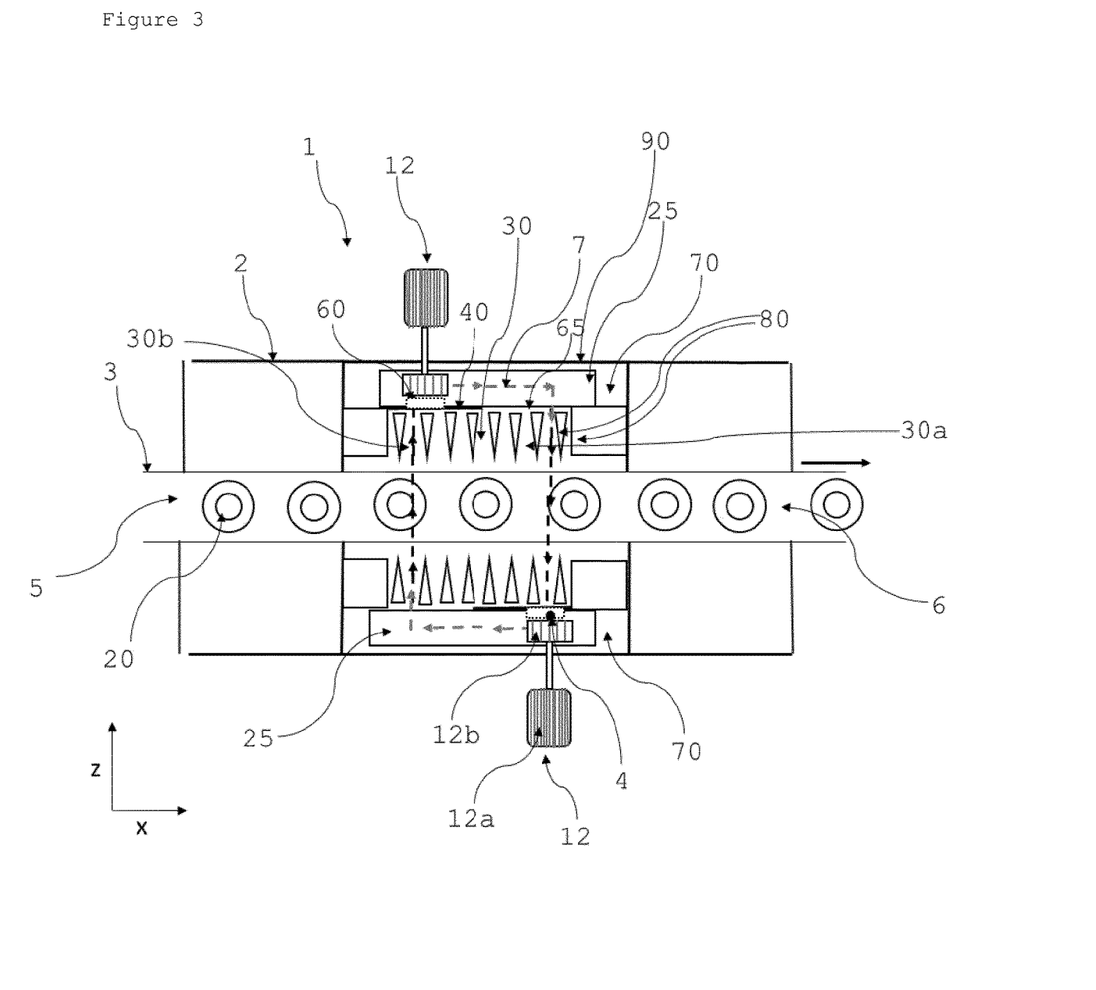
FIG. 3: schematic representation of the hood according to one embodiment of the present invention with guidance plate (25).

With regard to the coating apparatus of the present invention, it is shown schematically in FIG. 3, said coating apparatus (1) comprises a housing (2) with coating tunnel, a conveyer belt (3) moving the containers (20) through the coating tunnel from the inlet (5) to the outlet (6) of the said coating tunnel, one primary loop (7) with a least one feed point (4) for the coating compound, blowing means (12), and a guidance plate (25).

Optionally the coating apparatus of the present invention can comprise one or more recirculating loops.

In a one embodiment the coating hood according to the invention comprises additionally one or more recirculating loops.

The position of the recirculating loop or recirculating loops can be behind the primary loop (in view of the movement of the conveyer belt) or around the primary loop, latter possibility as shown in FIGS. 1 and 2 of the coating apparatus from the prior art.

Additionally the coating apparatus comprises at least one jet slot (30a) and receiver slot (30b) in the inner side wall (80), which are not shown in the FIG. 1. The slots (30) are respectively the entry or exit of the circuit (7) or each respective loop towards or from the central chamber of the coating tunnel, where the conveyer belt (3) with the containers (20) passes. By the jet slot (30a) the coating compound or carrier gas enters this chamber. By the receiver slot (30b) the coating compound or carrier gas leaves this chamber.

Preferably each circuit or loop of the coating apparatus (1) comprises at least one jet slot (30a) and receiver slot (30b).

Additionally the coating apparatus comprises blowing means or blowers (12). These blowers (12) keep the carrier gas with the coating compound circulating inside the hood and make it passing through the respective loops. The blower can either push the carrier gas with coating compound forward inside the centre section of the tunnel where the conveyer belt with the container passes or suck it outside. The blowing means (12) comprises a blower wheel (12b) and a motor (12a) for rotating the blower wheel. Depending on the sense of the rotation of the blower wheel and its blades, the carrier gas with the coating compound is either pushed or sucked.

The coating apparatus of the present invention comprises at least one guidance plate (25). The guidance plate (25) guides the carrier gas comprising the coating compound or coating generating compound.

Preferably the coating apparatus of the present invention comprises at least two guidance plates (25), each guidance plate (25) being on different sides of the conveyer belt (3).

With regard to the guidance plate (25), it is situated in a compartment (70) between the inner side wall (80) of the coating apparatus or hood (1) and the outer wall (90) of the hood. Both together make up a part of the housing (2). The inner side wall (80) of the hood comprises the slots (30).

Figure 6:
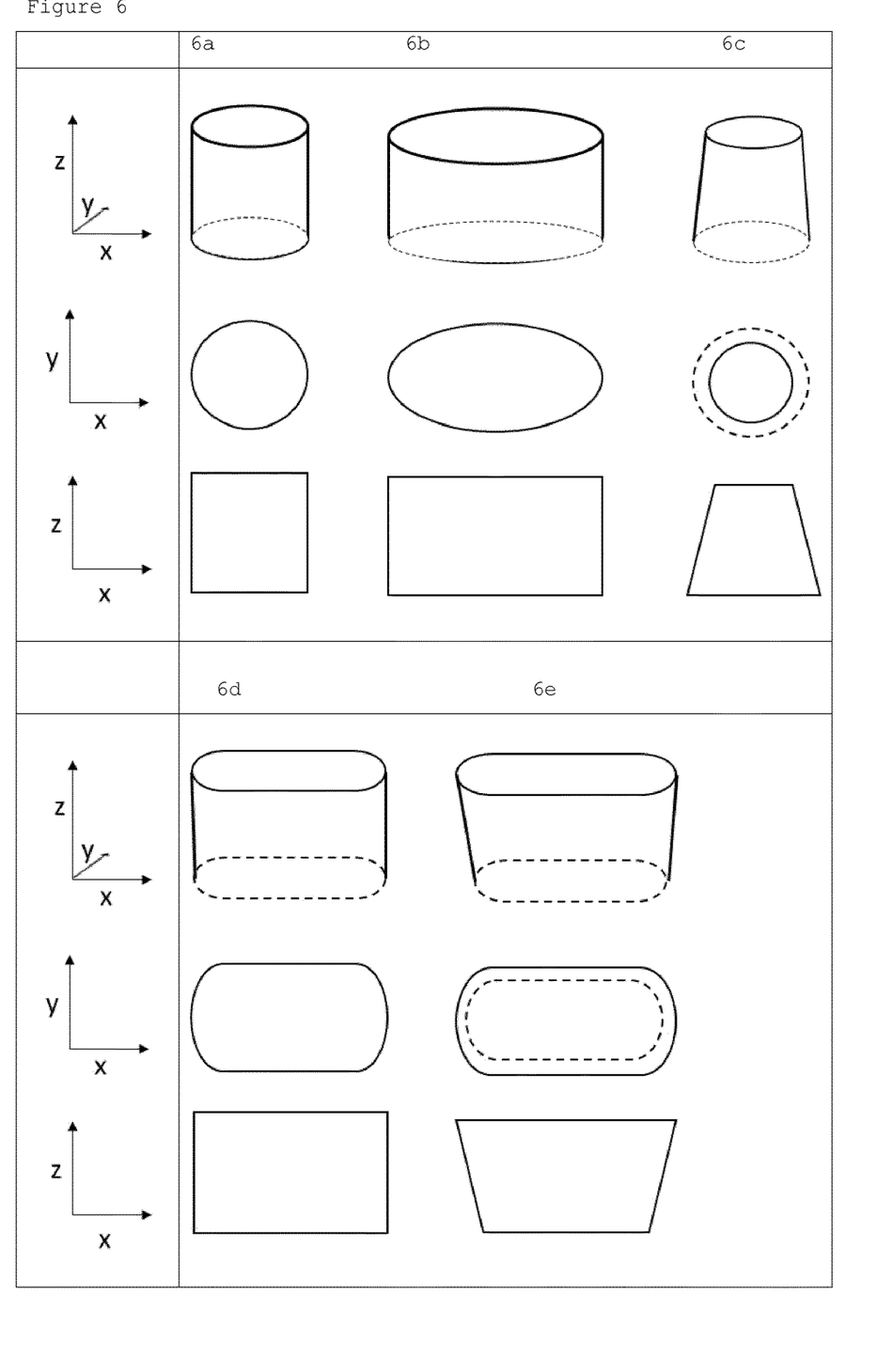
FIG. 6: variations of the of the guidance plate (25) in several views: dimensional view, top view and side view.

The compartment (70) comprising the guidance plate comprises also a fixing plate (40) with fixing means (50), a suction hole (60) and an exit (65). The rounded guidance plate (25) is mounted perpendicular to the fixing plate (40). This is shown for one possible embodiment in FIG. 4. Perpendicular does not mean exactly 90°. The guidance plate can be slightly tilted. It depends on the form of the guidance plate as shown in FIG. 6 for different possible embodiments. The angle of the guidance plate towards the x/y plane is 90°±30°, preferably 90°±25°.

The suction hole (60) is inside the fixing plate (40). The carrier gas loaded with the coating compound is sucked out of the area where the containers are passing by via this suction hole by before mentioned blowing means. The sucking is made by a turning blower wheel (12b) installed before the suction hole (60) inside the compartment (70).

The guidance place surrounds the suction hole (60) and the majority of exit (65) or exit hole. The fixing plate (40) comprising the suction hole (60) covers at most half of the surface of the compartment (70) towards the inner side wall (80). The exit (65) is the part of the compartment (70) not covered by the fixing plate (40).

The guidance plate can have different forms. Two examples are given in FIG. 6 where the guidance plate has various forms. Other geometries are easily imaginable.

In a preferred embodiment the guidance plate is made of stain less steel.

With regard to the form of the guidance plate (25), it is rounded. Preferably it comprises no edges or angles, expect for its border in the x/y plane. Different forms are shown in FIG. 6. The round guidance plate can be in form of a cylinder (FIGS. 6a and 6b)), either an elliptical (FIG. 6b) or circular cylinder (FIG. 6a), or rounded prism as a prism of a rounded rectangle (FIG. 6d) or a cone frustum (FIG. 6c), either an elliptical or circular cone frustum or twisted versions or variations of them or between them.

The size of the guidance plate (25) in x-, y-, and z-direction is adapted to the size of the compartment (70) where it is integrated in.

Its depth (z-direction) is close to the depth of the compartment (70), which is about the height of the blower wheel (12b). The depth is at least 1 cm. The depth is at most 30 cm. The depth is between 1 cm and 30 cm, preferably between 2 cm and 25 cm and more preferably between 5 cm and 20 cm.

Its maximal length (x-direction) is also slightly smaller to the length of the compartment (70). The length is at least 10 cm. The length is at most 150 cm. The length is between 10 cm and 150 cm, preferably between 20 cm and 120 cm and more preferably between 25 cm and 100 cm.

Its maximal height (y-direction) is also slightly smaller to the length of the compartment (70). The height is at least 5 cm. The height is at most 150 cm. The height is between 5 cm and 150 cm, preferably between 10 cm and 120 cm and more preferably between 15 cm and 100 cm.

Preferably the circuit (7) or loop comprising the guidance plate (25) comprises at least one blowing means (12). More preferably the coating apparatus of the present invention comprises at least two blowing means (12), the blowing means are on opposite sides of the coating apparatus, as shown in FIG. 3. Each compartment (70) comprising a guidance plate (25) possesses or is connected with these blowing means (12).

Preferably the two on opposite sides situated blower wheels (12b) of the at least two blowing means circulate in different meaning opposite directions. When looking from one side at the coating apparatus, one blower wheel rotates clockwise, while the other blower wheel on the other side rotates counter clockwise.

Preferably the blower wheel or blower wheels rotate between 100 rpm and 10 000 rpm, more preferably between 200 rpm and 9 000 rpm.

Optionally the coating apparatus according to the invention can comprise means for exhaust. This can be either at the inlet or at the outlet or at the inlet and the outlet additional exhaust means are present.

The coating compound is introduced through at least one feed point (4) in to the coating apparatus. This can be an internal feed point as in FIG. 1 or 3 or an external feed point.

In one embodiment the feed point (4) is based at the primary loop (7) as an internal feed point as shown in FIG. 3. The coating compound is introduced by the means of pipes, latter are not shown in the figure.

In another embodiment the coating compound is introduced by hot recirculating air as a side stream to dose the coating compound in, which is an external feed.

The hollow glass containers are transported in a single or double line by a conveyer through a tunnel formed in the coating hood under the housing. The conveyer carries the bottles in the direction designated by the arrow, in FIGS. 1, 2 and 3 from left to right.

With regard to the coating compound introduced in the coating apparatus at one or more feedings points, it can be chosen from organometallic compounds, metal halides or other suitable compounds as coating compound precursor.

Preferably the coating compound is an organic tin halogenide, advantageously it is monobutyl tin trichloride.

With regard to the coating formed at the surface of the containers and applied in the hood it is a metal oxide as $SnO_2$, $TiO_2$, $Al_2O_3$ or $ZnO$. The metal oxide is derived from the decomposition inorganic or organometallic compounds. Latter are the before mentioned coating generating compounds.

In a first preferred embodiment the coating is tin oxide. The tin oxide is derived from the decomposition inorganic or organic tin compound advantageously of an organic tin halogenide, more advantageously from monobutyl tin trichloride.

With regard to the process of applying a coating on the surface of glass containers, it comprises the steps of:
- conveying the glass containers (20) on a conveyer belt (3) through a coating tunnel inside a housing (1) from the inlet (5) to the outlet (6),
- circulating a coating compound through the coating tunnel with a circuit (7) comprising a guidance plate (25).

The circulation step of said process, circulates the coating compound or coating generating compounds that is introduced by a feed point (4) with the carrier gas by the help of blowing means (12). The circuit of the circulation step comprises the passage of the side wall (80) via the slots (30) inside the side wall. For entering the inner part of the coating tunnel where the container (20) are on the conveyer belt, the circuit leaves the compartment (70) comprising the guidance plate, via the exit hole (65), via the jet slots (30a). On the opposite side the circuit leaves the inner part of the coating tunnel where the container (20) are on the conveyer belt, via receiver slots (30b) and enter the opposite compartment comprising (70) comprising also a guidance plate (25) via suction hole (60). To return to the initial departing point the circuit continues in the same manner as described.

The technical details of the guidance plate are the same as describe before.

With regard to the glass container on which a coating has been applied on its surface by a process comprising the steps of:
- conveying the glass containers (20) on a conveyer belt (3) through a coating tunnel inside a housing (1) from the inlet (5) to the outlet (6),
- circulating a coating compound through the coating tunnel with a circuit (7) comprising a guidance plate (25).

Preferably the glass container on which a coating has been applied on its surface by a process that comprises additionally a step of blowing the gas comprising the coating generating compound with one or more recirculating loops (8) through the coating tunnel, after the circuit of primary loop (7).

With regard to the glass container on which a coating has been applied on its surface by a coating apparatus comprising:
- a housing (2) with a coating tunnel
- a conveyer belt (3) moving the containers (20) through the coating tunnel from the inlet (5) to the outlet (6) of the said coating tunnel
- at least one circuit (7) for circulation of a coating compound and
- at least one guidance plate (25).

The coating apparatus according to the invention is used to apply a coating on the surface of a glass containers.

The process according to the invention is used to apply a coating on the surface of a glass containers The present invention concerns as well an improved method for applying a hot end coating integrated in the glass container manufacturing process.

FIGURES

FIG. 1a: schematic representation of one existing hood from the state of the art with a recirculating loop.

Coating compound is introduced into the coating apparatus (1) or hood at a feed point (4). The hood (1) comprises a housing (2) and a conveyer belt (3) running there through. Containers (4) are transported on the belt that moves them from the entrance or inlet (5) to the exit outlet (6) of the hood (1).

The containers (20) are only presented diagrammatically by circles.

The hood also comprises one primary loop (7) with a least one feedpoint (4) for the coating compound, one or more recirculating loops (8) and exhaust means (11) in proximity of the inlet (5) end outlet (6).

FIG. 1b: schematic representation of one existing hood with an additional half loop (9).

Coating compound is introduced into the coating apparatus (1) or hood at a feed point (4). The hood (1) comprises a housing (2) and a conveyer belt (3) running there through. Containers (4) are transported on the belt, that moves them from the entrance or inlet (5) to the exit outlet (6) of the hood (1).

The containers (20) are only presented diagrammatically by circles.

The hood also comprises one primary loop (7) with a least one feedpoint (4) for the coating compound, one or more recirculating loops (8) and a half open loop (9) going from the outlet (6) to the inlet (5) of the coating tunnel.

FIG. 2: schematic representation of another existing hood from the state of the art where the inner side wall (80) with the slots (30) is more detailed. The hood (1) comprises a housing (2) and a conveyer belt (3) running there through. Containers (4) are transported on the belt that moves them from the entrance or inlet (5) to the exit outlet (6) of the hood (1). Behind the inner side wall (80) with the slots (30) blowing means (12) are shown, comprising a blower wheel (12b) and a motor (12a).

FIG. 3: schematic representation of a hood according to one embodiment of the present invention with two guidance plates (25). All elements are given on both sides of the conveyer belt and in order to not overload the figure the majority of the elements are only indicated by numbered flashes on the upper side of FIG. 3.

The guidance plates (25) are situated in a compartment (70) between the inner side wall (80) of the coating apparatus (1) and the outer wall (90). Also shown in compartment (70) is fixing plate (40), the suction hole (60) and exit (65).

The inner side wall (80) of the hood comprises the slots (30). The hood (1) comprises a housing (2) and a conveyer belt (3) running there through. Containers (4) are transported on the belt that moves them from the entrance or inlet (5) to the exit outlet (6) of the hood (1). Behind the inner side wall (80) with the slots (30) blowing means (12) are shown, comprising a blower wheel (12b) and a motor (12a).

The coating generating compound is introduced by a feed point (4) with the carrier gas by the help of blowing means (12). The circuit comprises the passage of the side wall (80) via the slots (30) inside the side wall. For entering the inner part of the coating tunnel where the container (20) are on the conveyer belt, the circuit leaves the compartment (70) comprising the guidance plate, via the exit hole (65), via the jet slots (30a). On the opposite side the circuit leaves the inner part of the coating tunnel where the container (20) are on the conveyer belt, via receiver slots (30b) and enter the opposite compartment comprising (70) comprising also a guidance plate (25) via suction hole (60). The blowing means on this side will continue to circulate the left coating generating compound in the same manner as explained before and a part of the coating generating compound returns to the initial departing point and the circuit begins again.

Figure 4:
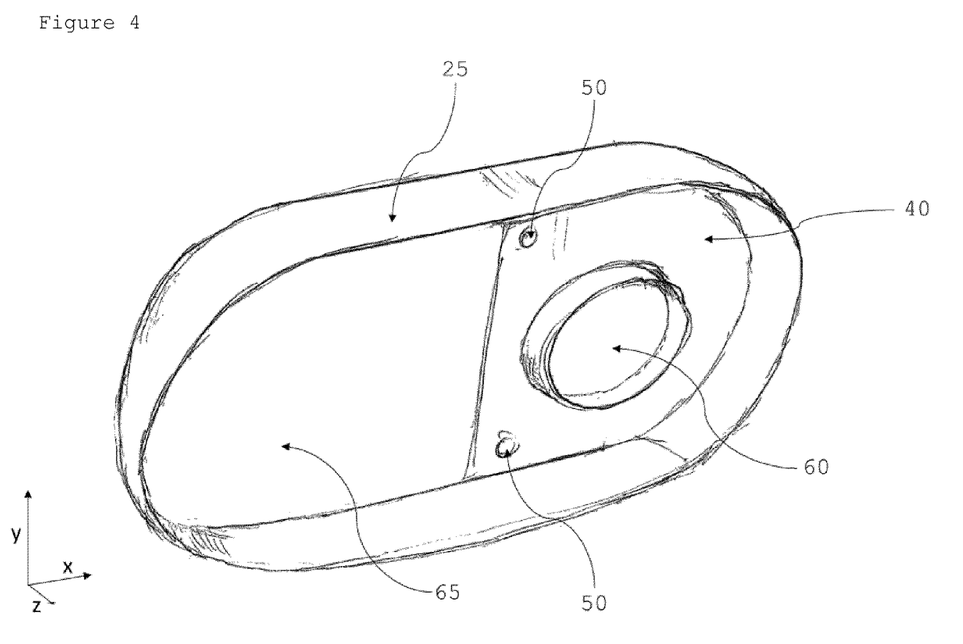
FIG. 4: schematic representation of one embodiment of the guidance plate (25).

FIG. 4: schematic dimensional representation of one embodiment of the guidance plate (25). Also shown is fixing plate (40) with fixing means (50), the suction hole (60) and an exit (65). The rounded guidance plate (25) is mounted perpendicular to the fixing plate (40).

Figure 5A:
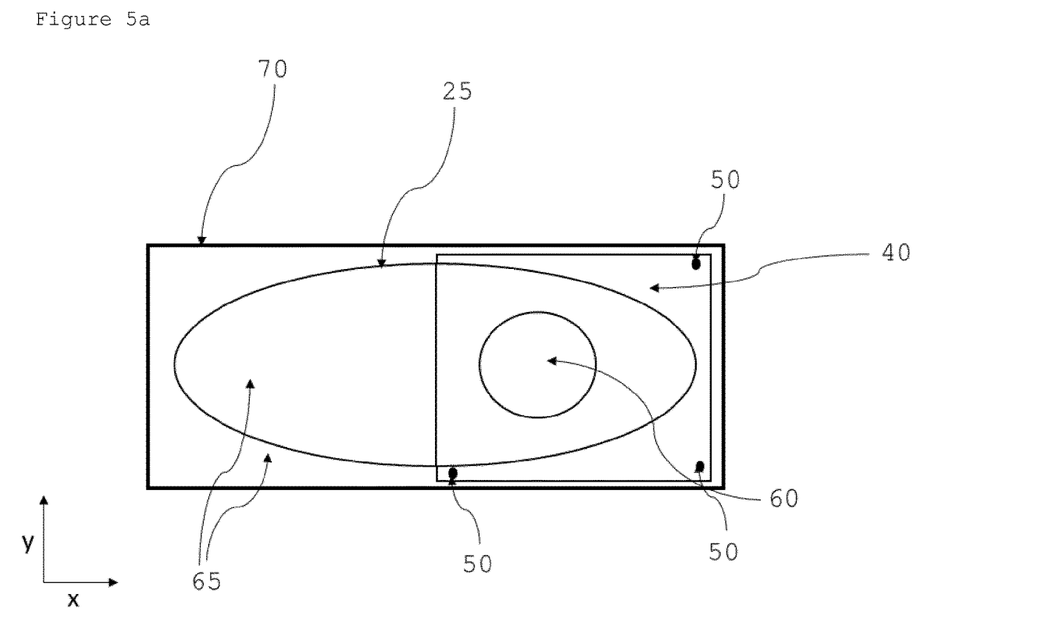
FIGS. 5a and 5b side view in the x/y plane of the compartment (70) comprising the guidance plate (25).

FIG. 5a: schematic side view in x/Y plane of one embodiment of the guidance plate (25) in compartment (70). Also shown is fixing plate (40) with fixing means (50), the suction hole (60) and an exit (65). The rounded guidance plate (25) is mounted perpendicular to the fixing plate (40).

Figure 5B:
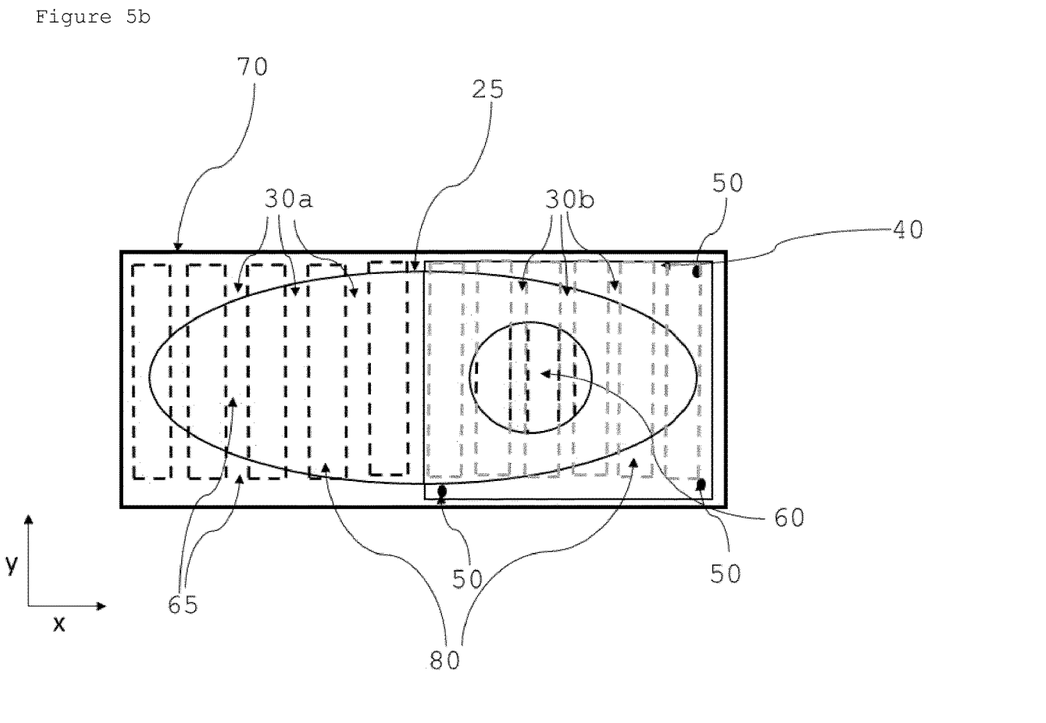

FIG. 5b: schematic side view in x/Y plane of one embodiment of the guidance plate (25) in compartment (70) with part of the side wall (80) and slots (30) in the side wall. Also shown is fixing plate (40) with fixing means (50), the suction hole (60) and an exit (65). The rounded guidance plate (25) is mounted perpendicular to the fixing plate (40). A part of side wall (80) and slots (30) in the side wall is hidden by fixing plate (40). The jet slots (30a) are behind the exit (65). The receiver slots are behind the fixing plate (40).

FIG. 6: variations of the of the guidance plate (25) in several views: dimensional view, top view (z/x plane) and side view (x/y plane). The round guidance plate can be in form of a cylinder (FIGS. 6a and 6b)), either an elliptical (FIG. 6b) or circular cylinder (FIG. 6a), or rounded prism as a prism of a rounded rectangle (FIG. 6d) or a cone frustum (FIGS. 6c and 6e)), either an elliptical (FIG. 6e) or circular cone frustum (FIG. 6c).

It has been noted that a coating apparatus comprising such a guidance plate or guidance plates has reduced number of cleaning intervals, meaning it can be used longer, without opening and cleaning, in comparison with a coating apparatus not having such guidance plate or guidance plates.

The invention claimed is:

1. A coating apparatus (1) for applying a coating on glass containers with a chemical compound comprising:
- a housing (2) with a coating tunnel, said housing (2) comprising an inner side wall (80) and an outer wall (90),
- a conveyer belt (3) moving the containers (20) through the coating tunnel from the inlet (5) to the outlet (6) of the said coating tunnel,
- at least one circuit (7) for circulation of a coating compound,
- at least one guidance plate (25) situated in a compartment (70) between the inner side wall (80) of the coating apparatus (1) and the outer wall (90), configured to guide a carrier gas comprising the coating compound, wherein the guidance plate (25) is in the form of either an elliptical or circular cylinder, or rounded prism as a prism of a rounded rectangle or a cone frustum, either an elliptical or circular cone frustum and
- in the compartment (70) comprising the guidance plate (25), a fixing plate (40) which is separate and distinct from said housing (2) and to which said guidance plate (25) is rigidly mounted such that angles of the guidance plate (25) to the fixing plate are fixed, a suction hole (60) inside the fixing plate, and an exit (65).

2. The coating apparatus according to claim 1 comprising at least two guidance plates (25).

3. The coating apparatus according to claim 1 comprising at least one of the following:
- a blower (12),
- at least one feed point (4),
- slots (30) in the inner side wall (80).

4. The coating apparatus according to claim 1 wherein the guidance plate (25) is rounded.

5. A coating apparatus according to claim 1 wherein the guidance plate (25) has a depth between 1 cm and 30 cm, a length between 10 cm and 150 cm and a height between 5 cm and 150 cm.

6. A coating apparatus according to claim 1 wherein an angle of the guidance plate (25) towards the fixing plate (40) is 90°±30°.

7. A coating apparatus according to claim 1, wherein said apparatus comprises at least two blowers (12), said blowers being on opposite sides of the coating apparatus.

8. A coating apparatus according to claim 7, wherein said apparatus comprises two on opposite sides situated blower wheels (12b) of the at least two blowers that circulate in opposite directions.

* * * * *